United States Patent
Hung et al.

(10) Patent No.: US 10,536,135 B2
(45) Date of Patent: Jan. 14, 2020

(54) PSEUDO RESISTOR WITH TUNABLE RESISTANCE

(71) Applicant: Winbond Electronics Corp., Taichung (TW)

(72) Inventors: Chung-Chih Hung, Taichung (TW); Jia-Heng Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/666,574

(22) Filed: Aug. 2, 2017

(65) Prior Publication Data

US 2018/0234081 A1 Aug. 16, 2018

(30) Foreign Application Priority Data

Feb. 13, 2017 (CN) .......................... 2017 1 0076077

(51) Int. Cl.
*H03H 11/24* (2006.01)
*H03H 11/46* (2006.01)

(52) U.S. Cl.
CPC .......... *H03H 11/245* (2013.01); *H03H 11/53* (2013.01); *H03F 2203/45524* (2013.01)

(58) Field of Classification Search
CPC .................. H03H 11/245; H03H 11/53; H03F 2203/45524
See application file for complete search history.

(56) References Cited

U.S. PATENT DOCUMENTS

| | | | | |
|---|---|---|---|---|
| 5,264,785 A | * | 11/1993 | Greason | G05F 3/24 323/313 |
| 6,909,323 B2 | | 6/2005 | Ueno et al. | |
| 7,298,010 B1 | * | 11/2007 | Ma | H01L 23/556 257/357 |
| 7,339,384 B2 | | 3/2008 | Peng et al. | |
| 7,391,260 B2 | * | 6/2008 | Kim | H03F 1/08 330/253 |
| 7,920,005 B2 | * | 4/2011 | Yazicioglu | A61B 5/0428 327/276 |
| 8,344,810 B2 | * | 1/2013 | Lian | H03F 3/187 330/305 |

(Continued)

FOREIGN PATENT DOCUMENTS

CN 105051555 11/2015
TW 201212532 3/2012

*Primary Examiner* — Jung Kim
(74) *Attorney, Agent, or Firm* — JCIPRNET

(57) ABSTRACT

A pseudo resistor with tunable resistance including a first transistor and a second transistor is provided. The first transistor has a first terminal, a second terminal and a control terminal. The first terminal of the first transistor serves as a first terminal of the pseudo resistor. The control terminal of the first transistor receives a control voltage. The first transistor is controlled by the control voltage, such that the first transistor operates in a weak inversion region. The second transistor has a first terminal, a second terminal and a control terminal. The first terminal of the second transistor is coupled to the second terminal of the first transistor. The second terminal of the second transistor and the control terminal of the second transistor are coupled to each other to serve as a second terminal of the pseudo resistor with tunable resistance. The second transistor operates in the weak inversion region.

6 Claims, 3 Drawing Sheets

(56) References Cited

U.S. PATENT DOCUMENTS 8,626,110 B2 * 1/2014 Cheng ............... H04W 52/0229
455/343.2
2014/0070873 A1 3/2014 Gunther et al.

* cited by examiner

PSEUDO RESISTOR WITH TUNABLE RESISTANCE

CROSS-REFERENCE TO RELATED APPLICATION

This application claims the priority benefit of China application serial no. 201710076077.0, filed on Feb. 13, 2017. The entirety of the above-mentioned patent application is hereby incorporated by reference herein and made a part of this specification.

BACKGROUND OF THE INVENTION

1. Field of the Invention

The invention relates to a pseudo resistor, and more particularly, to a pseudo resistor with tunable resistance.

2. Description of Related Art

In the technical field of medical electronics, signals received by medical equipments belong to a physiological signal in audio fashion. An audio band-pass filter at a receiver of the medical equipment needs to reliably filter out low frequency noises in the received signals in order to accurately capture the physiological signal for use in subsequent analysis and process. In general, the audio band-pass filter can only achieve its bandwidth requirements by adopting a resistance with high impedance. As a common approach, a resistor with high resistance is disposed outside a chip having the audio band-pass filter. However, this resistor with high resistance is usually larger in size and thus occupies larger space.

Therefore, in recent years, a metal oxide semiconductor field effect transistor (MOSFET) has been widely adopted to realize a pseudo resistor with high resistance. Such pseudo resistor can realize approximation of the resistance with high impedance resistance by utilizing a minor current of the MOSFET operating in a weak inversion region together a fixed cross voltage at two terminals of the MOSFET. Meanwhile, the pseudo resistor implemented by using the MOSFET also enables a full Chip-Integration design for the entire circuit. As shown in FIG. 1, a pseudo resistor 900 includes MOSFETs 910 and 920 connected to each other in series. The MOSFETs 910 and 920 are controlled by a control voltage Vctrl at the same time to operate in the weak inversion region, and a resistance of the pseudo resistor 900 can be adjusted by the control voltage Vctrl. Nonetheless, because the MOSFETs 910 and 920 must operate in the weak inversion region, signal amplitudes at two terminals (i.e., a first terminal N1 and a second terminal N2) of the pseudo resistor 900 are to be restricted so as to prevent a resistance variation of the pseudo resistor 900 from becoming overly large. As the signal amplitudes at the two terminals of the pseudo resistor 900 are restricted, application scope of the pseudo resistor 900 is also limited.

SUMMARY OF THE INVENTION

Accordingly, the invention is directed to a pseudo resistor with tunable resistance, which is capable of reducing an effect of the signal amplitudes at two terminals of the pseudo resistor on a resistance of the pseudo resistor and making application scope of the pseudo resistor more extensive.

The pseudo resistor with tunable resistance of the invention includes a first transistor and a second transistor. The first transistor has a first terminal, a second terminal and a control terminal. The first terminal of the first transistor serves as a first terminal of the pseudo resistor. The control terminal of the first transistor receives a control voltage. The first transistor is controlled by the control voltage, such that the first transistor operates in a weak inversion region. The second transistor has a first terminal, a second terminal and a control terminal. The first terminal of the second transistor is coupled to the second terminal of the first transistor. The second terminal of the second transistor and the control terminal of the second transistor are coupled to each other to serve as a second terminal of the pseudo resistor with tunable resistance. The second transistor also operates in the weak inversion region due to an extremely small conductive current.

In an embodiment of the invention, each of the first transistor and the second transistor is a P-type metal oxide semiconductor field effect transistor.

In an embodiment of the invention, a voltage value of the control voltage is adjustable and greater than 0 V.

In an embodiment of the invention, a body terminal of the first transistor is coupled to the first terminal of the first transistor.

In an embodiment of the invention, a body terminal of the second transistor is coupled to the second terminal of the second transistor.

In an embodiment of the invention, each of the first transistor and the second transistor is an N-type metal oxide semiconductor field effect transistor.

In an embodiment of the invention, the first terminal of the first transistor is a signal input terminal, the second terminal of the second transistor is a signal output terminal, and a signal variation at the second terminal of the second transistor is greater than a signal variation at the first terminal of the first transistor.

In an embodiment of the invention, a voltage value of the control voltage is 0 V.

In an embodiment of the invention, a body terminal of the first transistor is coupled to the first terminal of the first transistor, and a body terminal of the second transistor is coupled to the second terminal of the second transistor.

Based on the above, the design of the pseudo resistor with tunable resistance proposed by the embodiments of the invention not only features high resistance and tunable resistance but also reduces the effect of the signal variations at the two terminals of the pseudo resistor on the resistance of the pseudo resistor. As a result, since no restriction on the voltage magnitude is required for the two terminals of the pseudo resistor in application, application scope of the pseudo resistor can be more extensive.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
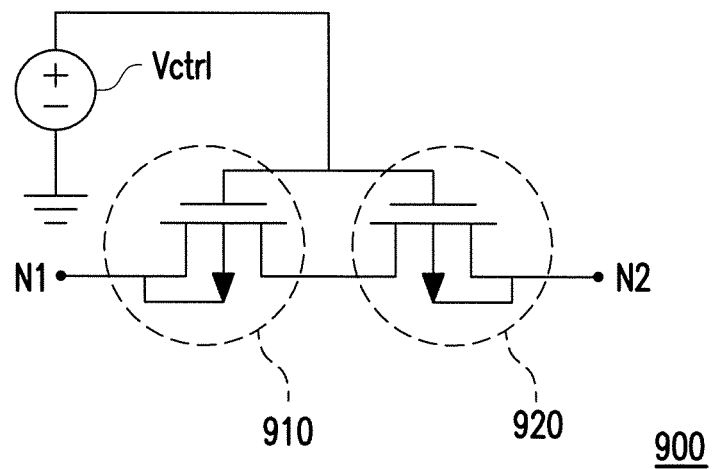
FIG. 1 is a schematic diagram illustrating a circuit structure of a conventional pseudo resistor.

Reference will now be made in detail to the present preferred embodiments of the invention, examples of which are illustrated in the accompanying drawings. In addition, wherever possible, the same reference numbers are used in the drawings and the description to refer to the same or like parts.

Figure 2:
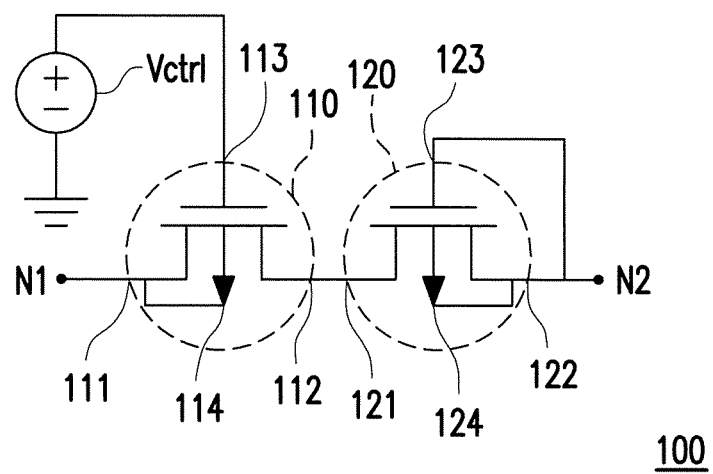
FIG. 2 is a schematic diagram illustrating a circuit structure of a pseudo resistor with tunable resistance according to an embodiment of the invention.

Next, with reference to FIG. 2, FIG. 2 is a schematic diagram illustrating a circuit structure of a pseudo resistor 100 with tunable resistance (referred to as the pseudo resistor 100 hereinafter) according to an embodiment of the invention. The pseudo resistor 100 includes a first transistor 110 and a second transistor 120. The first transistor 110 has a first terminal 111, a second terminal 112 and a control terminal 113. The first terminal 111 of the first transistor 110 is configured to serve as a first terminal N1 of the pseudo resistor 100. The control terminal 113 of the first transistor 110 is configured to receive a control voltage Vctrl. The first transistor 110 is controlled by the control voltage Vctrl to operate in a weak inversion region.

The second transistor 120 has a first terminal 121, a second terminal 122 and a control terminal 123. The first terminal 121 of the second transistor 120 is coupled to the second terminal 112 of the first transistor 110. The second terminal 122 of the second transistor 120 and the control terminal 123 of the second transistor 120 are coupled to each other to serve as a second terminal N2 of the pseudo resistor 100. The second transistor 120 also operates in the weak inversion region.

In the embodiment shown in FIG. 2, each of the first transistor 110 and the second transistor 120 is a P-type MOSFET, but the invention is not limited thereto.

In the embodiment shown in FIG. 2, a body terminal 114 of the first transistor 110 is coupled to the first terminal 111 of the first transistor 110 and a body terminal 124 of the second transistor 120 is coupled to the second terminal 122 of the second transistor 120, but the invention is not limited thereto. In other embodiments of the invention, the body terminal 114 of the first transistor 110 may also be coupled to the second terminal 112 of the first transistor 110 and the body terminal 124 of the second transistor 120 may also be coupled to the first terminal 121 of the second transistor 120, depending on the practical applications or design requirements.

In actual operation, it is assumed herein that the first terminal N1 of the pseudo resistor 100 is a signal input terminal, the second terminal N2 of the pseudo resistor 100 is a signal output terminal, and a signal variation at the second terminal N2 is greater than a signal variation at the first terminal N1. Since the control terminal 123 and the second terminal 122 of the second transistor 120 are coupled to each other to serve as the second terminal N2 (i.e., the signal output terminal) of the pseudo resistor 100, a signal variation at the control terminal 123 and the second terminal 122 of the second transistor 120 can be changed together according to the signal variation at the signal output terminal. In other words, regardless of how the signal at the signal output terminal changes, a voltage difference between the control terminal 123 and the second terminal 122 of the second transistor 120 remains unchanged (i.e., 0 V). Therefore, the second transistor 120 can operate in the weak inversion region, and can reduce the effect of the signal variations at the signal output terminal on a resistance between the first terminal 121 and the second terminal 122 of the second transistor 120.

On the other hand, a voltage value of the control voltage Vctrl is adjustable and greater than 0 V, such that the first transistor 110 can operate in the weak inversion region and can adjust a resistance between the first terminal 111 and the second terminal 112 of the first transistor 110 according to the control voltage Vctrl to accomplish the purpose of adjusting the resistance of the pseudo resistor 100.

In general, with combination of the first transistor 110 and the second transistor 120, the pseudo resistor 100 can feature high resistance and tunable resistance while also reducing the effect of signal variations at the signal output terminal on the resistance of the pseudo resistor 100, such that application scope of pseudo resistor 100 can be more extensive.

Figure 3:
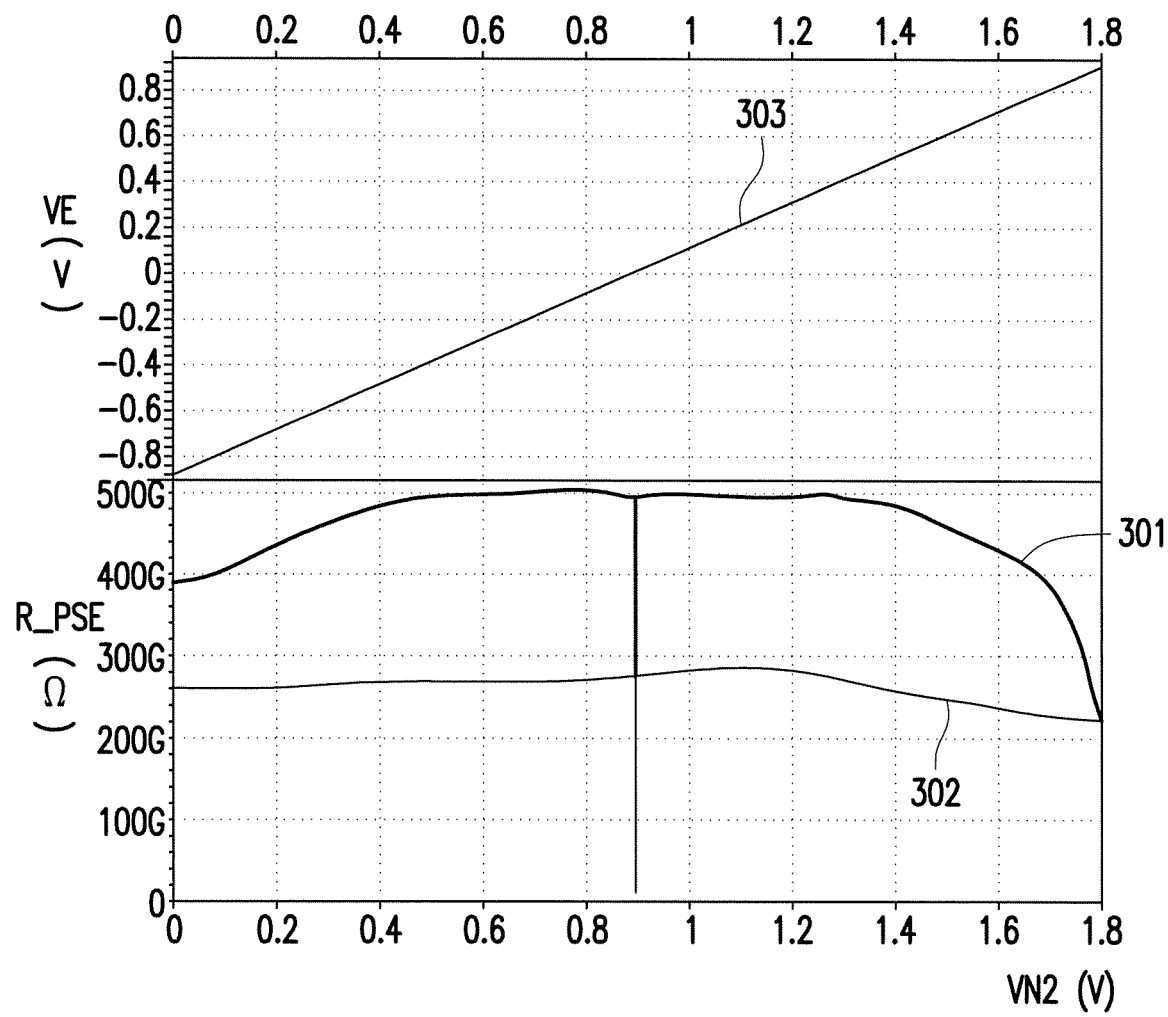
FIG. 3 is a schematic diagram illustrating the effect of voltage variations at two terminals of the pseudo resistor on a resistance of the pseudo resistor.

Next, with reference to FIG. 1 to FIG. 3 together, FIG. 3 is a schematic diagram illustrating the effect of voltage variations at two terminals of the pseudo resistor on the resistance of the pseudo resistor. A horizontal axis of FIG. 3 represents a voltage value VN2 at the second terminal N2 of the pseudo resistor 900 in FIG. 1 or at the second terminal N2 of the pseudo resistor 100 in FIG. 2, a vertical axis at an upper half of FIG. 3 represents a voltage difference VE between the two terminals of the pseudo resistor 900 or between the two terminals of the pseudo resistor 100, and a vertical axis at lower half of FIG. 3 represents a resistance R_PSE of the pseudo resistor 900 or the pseudo resistor 100. Specifically, in FIG. 3, a waveform 301 represents the resistance of the pseudo resistor 900 in correspondence to the voltage value VN2 at the second terminal N2 of the pseudo resistor 900 changed from 0 V to 1.8 V when the voltage at the first terminal N1 of the pseudo resistor 900 and the control voltage Vctrl in FIG. 1 are 0.9 V and 1.8 V respectively; a waveform 302 represents the resistance of the pseudo resistor 100 in correspondence to the voltage value VN2 at the second terminal N2 of the pseudo resistor 100 changed from 0 V to 1.8 V when the voltage at the first terminal N1 of the pseudo resistor 100 and the control voltage Vctrl in FIG. 2 are 0.9 V and 1.8 V respectively; a waveform 303 represents the voltage difference between the two terminals (i.e., the first terminal N1 and the second terminal N2) of the pseudo resistor 100 or the voltage difference between the two terminals of the pseudo resistor 900.

In view of FIG. 3, when the voltage difference VE between the two terminals of the pseudo resistor 900 is greater than 0.45 V or less than −0.45 V, the resistance of the pseudo resistor 900 shows a sudden dropping. Consequently, in an application scenario where a stable resistance is required, the voltage difference VE between the two terminals of the pseudo resistor 900 is bound to be restricted between −0.45 V and 0.45 V. In comparison with the pseudo resistor 900, the resistance of the pseudo resistor 100 is relatively more stable because the voltage difference between the control terminal 123 and the second terminal 122 of the second transistor 120 of the pseudo resistor 100 remains unchanged (i.e., unaffected by the voltage variation at the second terminal N2 of the pseudo resistor 100). Accordingly, the voltage variation at the second terminal N2 of the pseudo resistor 100 has less effect on the resistance between the first terminal 121 and the second terminal 122 of the second transistor 120 and thus has limited effect on the resistance of the pseudo resistor 100. That is to say, in various applications adopting the pseudo resistor 100, the designer does not have to restrict the voltage magnitude for the two terminals of the pseudo resistor 100 such that application scope of the pseudo resistor 100 can be more extensive.

Figure 4:
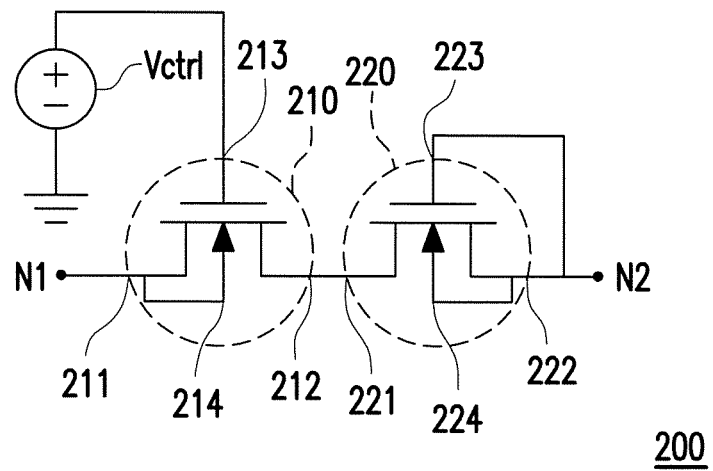
FIG. 4 is a schematic diagram illustrating a circuit structure of a pseudo resistor with tunable resistance according to another embodiment of the invention.

Next, with reference to FIG. 4, FIG. 4 is a schematic diagram illustrating a circuit structure of a pseudo resistor 200 with tunable resistance (referred to as the pseudo resistor 200 hereinafter) according to another embodiment of the invention. The pseudo resistor 200 includes a first transistor 210 and a second transistor 220. The first transistor 210 has a first terminal 211, a second terminal 212, a control terminal 213 and a body terminal 214. The second transistor 220 has a first terminal 221, a second terminal 222, a control terminal 223 and a body terminal 224. Coupling methods of the first transistor 210 and the second transistor 220 are similar to coupling methods of the first transistor 110 and the second transistor 120 in FIG. 2 and can refer to the related description of FIG. 2 above, which is thus not repeated hereinafter.

In comparison with the first transistor 110 and the second transistor 120 of FIG. 2 being the P-type MOSFET where the voltage value of the control voltage Vctrl being greater than 0 V, each of the first transistor 210 and the second transistor 220 of FIG. 4 is an N-type MOSFET and the voltage value of the control voltage Vctrl is 0 V. In actual operation, both the first transistor 210 and the second transistor 220 of FIG. 4 operate in the weak inversion region. Also, operations and effects of the pseudo resistor 200 of FIG. 4 are also similar to those of the pseudo resistor 100 of FIG. 2 and can also refer to the related description above, which is not repeated hereinafter.

Figure 5:
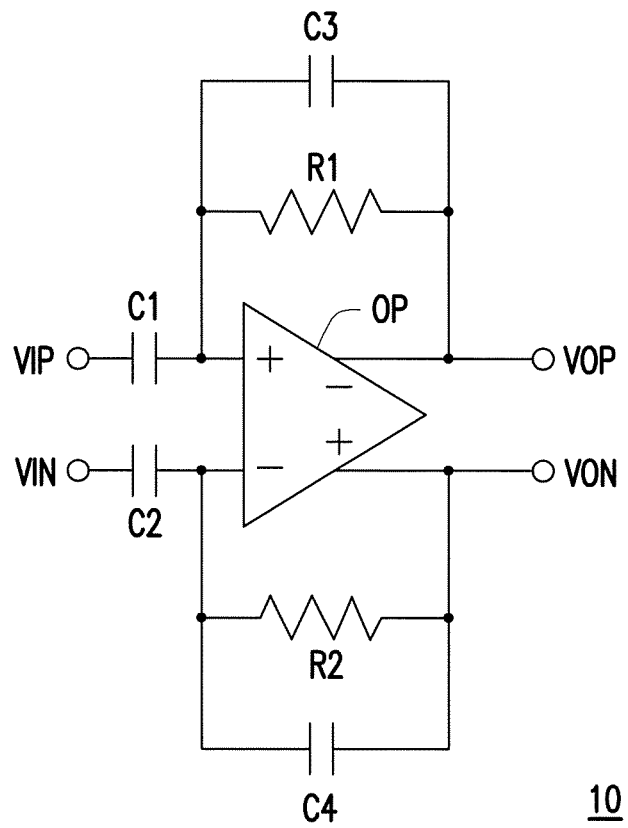
FIG. 5 is a band-pass filter implemented by adopting the pseudo resistor of FIG. 2 or FIG. 4 of the invention.

Next, with reference to FIG. 5, FIG. 5 is a band-pass filter 10 implemented by adopting the pseudo resistor 100 of FIG. 2 or the pseudo resistor 200 of FIG. 4 of the invention. The band-pass filter 10 includes an operational amplifier OP, capacitors C1 to C4 and resistors R1 and R2. A first terminal of the capacitor C1 is configured to receive a first input signal VIP. A second terminal of the capacitor C1 is coupled to a non-inverting input terminal of the operational amplifier OP. A first terminal of the capacitor C2 is configured to receive a second input signal VIN. A second terminal of the capacitor C2 is coupled to an inverting input terminal of the operational amplifier OP. The first input signal VIP and the second input signal VIN may be a differential input signal, but the invention is not limited thereto.

The capacitor C3 and the resistor R1 are connected in parallel and coupled between the non-inverting input terminal and the inverting input terminal of the operational amplifier OP to output a first output signal VOP. The capacitor C4 and the resistor R2 are connected in parallel and coupled between the inverting input terminal and the non-inverting input terminal of the operational amplifier OP to output a second output signal VON. The first output signal VOP and the second output signal VON may be a differential output signal, but the invention is not limited thereto. Details regarding the operations of the band-pass filter 10 are well-known by persons skilled in the art, which are not omitted hereafter.

It is noted that, the resistors R1 and R2 can be implemented by the pseudo resistor 100 depicted in FIG. 2 or the pseudo resistor 200 depicted in FIG. 4. The pseudo resistors 100 and 200 featuring a stable high resistance enables the band-pass filter 10 to feature a stable low cut-off frequency to be applicable in filtering process on VLF (very low frequency) audio signals in the field of medical technology, but the invention is not limited thereto. In other embodiments of the invention, the pseudo resistor 100 of FIG. 2 and the pseudo resistor 200 of FIG. 4 are also applicable in any other analog circuit that requires the stable high resistance.

In summary, the design of the pseudo resistor proposed by the embodiments of the invention not only features high resistance and tunable resistance but also reduces the effect of the signal variations at the two terminals of the pseudo resistor on the resistance of the pseudo resistor. As a result, since no restriction on the voltage magnitude is required for the two terminals of the pseudo resistor in application, application scope of the pseudo resistor can be more extensive.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pseudo resistor with tunable resistance, comprising:
   a first transistor having a first terminal, a second terminal and a control terminal, the first terminal of the first transistor serving as a first terminal of the pseudo resistor with tunable resistance, and the control terminal of the first transistor receiving a control voltage, wherein the first transistor is controlled by the control voltage, and the control terminal of the first transistor is not coupled to the first terminal and the second terminal of the first transistor; and
   a second transistor having a first terminal, a second terminal and a control terminal, the first terminal of the second transistor being coupled to the second terminal of the first transistor, and the second terminal of the second transistor and the control terminal of the second transistor being directly coupled to each other to serve as a second terminal of the pseudo resistor with tunable resistance,
   wherein the first terminal of the first transistor is a signal input terminal, the second terminal of the second transistor is a signal output terminal, and a signal variation at the second terminal of the second transistor is greater than a signal variation at the first terminal of the first transistor,
   wherein each of the first transistor and the second transistor is a P-type metal oxide semiconductor field effect transistor.

2. The pseudo resistor with tunable resistance according to claim 1, wherein the first transistor operates in a weak inversion region.

3. The pseudo resistor with tunable resistance according to claim 1, wherein the second transistor operates in a weak inversion region.

4. The pseudo resistor with tunable resistance according to claim 1, wherein a voltage value of the control voltage is adjustable and greater than 0 V.

5. The pseudo resistor with tunable resistance according to claim 1, wherein a body terminal of the first transistor is coupled to the first terminal of the first transistor.

6. The pseudo resistor with tunable resistance according to claim 1, wherein a body terminal of the second transistor is coupled to the second terminal of the second transistor.

* * * * *